United States Patent
Zhang et al.

(10) Patent No.: US 9,472,615 B2
(45) Date of Patent: Oct. 18, 2016

(54) SUPER JUNCTION LDMOS FINFET DEVICES

(71) Applicant: BROADCOM CORPORATION, Irvine, CA (US)

(72) Inventors: Qintao Zhang, Tustin, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/598,119

(22) Filed: Jan. 15, 2015

(65) Prior Publication Data
US 2016/0181358 A1    Jun. 23, 2016

Related U.S. Application Data (60) Provisional application No. 62/095,400, filed on Dec. 22, 2014.

(51) Int. Cl.
| | | |
|---|---|---|
| *H01L 29/00* | (2006.01) | |
| *H01L 29/06* | (2006.01) | |
| *H01L 29/78* | (2006.01) | |
| *H01L 29/66* | (2006.01) | |
| *H01L 29/49* | (2006.01) | |

(52) U.S. Cl.
CPC ....... *H01L 29/0634* (2013.01); *H01L 29/4908* (2013.01); *H01L 29/6681* (2013.01); *H01L 29/66681* (2013.01); *H01L 29/66689* (2013.01); *H01L 29/7823* (2013.01); *H01L 29/7851* (2013.01); *H01L 29/7855* (2013.01)

(58) Field of Classification Search
CPC ............ H01L 29/0634; H01L 29/66681; H01L 29/4908; H01L 29/7823; H01L 29/0653; H01L 29/7855; H01L 29/7851; H01L 29/6681; H01L 29/401
See application file for complete search history.

(56) References Cited

U.S. PATENT DOCUMENTS

| | | | |
|---|---|---|---|
| 2013/0011985 A1 | 1/2013 | Ratnam | |
| 2013/0328162 A1* | 12/2013 | Hu | H01L 27/0629 257/526 |
| 2014/0191315 A1 | 7/2014 | Ito | |
| 2015/0014809 A1* | 1/2015 | Wang | H01L 29/861 257/506 |
| 2015/0263089 A1* | 9/2015 | Singh | H01L 29/0688 257/618 |

OTHER PUBLICATIONS

Park, et al., "Super Junction LDMOS Transistors," IEEE Circuits & Devices Magazine, Nov./Dec. 2006, pp. 10-15.
Kanemura, et al., "Improvement of Drive Current in Bulk-FinFET using Full 3D Process/Device Simulations," IEEE SISPAD 2006, pp. 131-134.

\* cited by examiner

*Primary Examiner* — Nikolay Yushin
(74) *Attorney, Agent, or Firm* — McDermott Will & Emery LLP (57) ABSTRACT

A fin-shaped field-effect transistor (finFET) device is provided. The finFET device includes a substrate material with a top surface and a bottom surface. The finFET device also includes a well region formed in the substrate material. The well region may include a first type of dopant. The finFET device also includes a fin structure disposed on the top surface of the substrate material. A portion of the fin structure may include the first type of dopant. The finFET device also includes an oxide material disposed on the top surface of the substrate material and adjacent to the portion of the fin structure. The finFET device also includes a first epitaxial material disposed over a portion of the fin structure. The first epitaxial material may include a second type of dopant.

20 Claims, 9 Drawing Sheets

SUPER JUNCTION LDMOS FINFET DEVICES

CROSS-REFERENCE TO RELATED APPLICATIONS

The present application claims the benefit of U.S. Provisional Patent Application No. 62/095,400, entitled "Super Junction LDMOS FinFET Devices", filed on Dec. 22, 2014, which is hereby incorporated by reference in its entirety for all purposes.

TECHNICAL FIELD

The present description relates generally to field effect transistors, including super junction lateral double-diffused metal-oxide-semiconductor (LDMOS) fin-based field effect transistor (finFET) devices.

BACKGROUND

As semiconductor devices increase in layout density, technology scaling has led to the development of fin-based, also referred to as fin-shaped, field effect transistor structures as an alternative to bulk metal-oxide-semiconductor field-effect transistor (MOSFET) structures for improved scalability. Fin-based manufacturing techniques may be employed to create non-planar structures on a semiconductor substrate material (e.g., silicon), which may increase device density since the channel, source, and/or drain are raised out of the semiconductor substrate material in the form of a fin. The finFET utilizes a fin to wrap the conducting channel. During operation, current flows between the source and drain terminals along the gated sidewall surfaces of the fin.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. One or more implementations of the subject disclosure are illustrated by and/or described in connection with one or more figures and are set forth in the claims.

The subject technology provides finFET devices with super junction LDMOS structures. The super junction LDMOS structures may include multiple alternating regions of n- and p-type doped semiconductor. In one or more implementations, the subject technology allows for smaller devices that may be operated at higher voltages and may have lower on-resistance. In one or more implementations, the subject technology provides compatibility with existing finFET-based complementary MOS (CMOS) device fabrication process flows, including smaller technologies such as 14 nm and 16 nm technologies. The LDMOS structures may be provided, for example, in integrated circuits that utilize 3.3 V and 5.0 V input/output (I/O) operating voltages.

Figure 1:
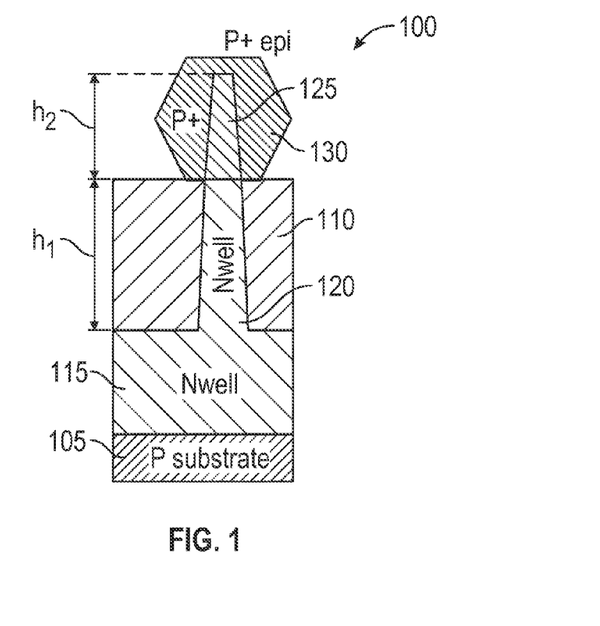
FIG. 1 illustrates a cross-sectional view of a finFET device along a direction perpendicular to a fin length, in accordance with one or more implementations.

FIG. 1 illustrates a cross-sectional view of a finFET device 100 along a direction perpendicular to a fin length, in accordance with one or more implementations. Not all of the depicted components may be used, however, and one or more implementations may include additional components not shown in the figure. Variations in the arrangement and types of the components may be made without departing from the spirit or scope of the claims as set forth herein. Additional, different, or fewer components may be provided The finFET device 100 may include a substrate material 105 with a top surface and a bottom surface, and a fin structure disposed on the top surface. In one or more implementations, the substrate material 105 may be, or may include, semiconductor material such as silicon, silicon-germanium, and gallium-arsenide. An oxide material 110 may be disposed on the top surface. In one or more implementations, the oxide material 110 may be grown as part of a shallow trench isolation (STI) process.

A well region 115 may be formed in the substrate material 105. The forming of the well region 115 may include doping at least a portion of the substrate material 105 and a portion 120 of the fin structure, where the oxide material 110 is adjacent to the portion 120. The portion 120 of the fin structure may have a height $h_1$ of approximately 60 nm. The height $h_1$ of the portion 120 of the fin structure may be defined by an oxide thickness of the oxide material 110. A portion 125 of the fin structure may be doped differently from the portion 120. For example, if the well region 115 and the portion 120 of the fin structure are doped with n-type dopants (e.g., arsenic, phosphorus), then the portion 125 of the fin structure may be doped with p-type dopants (e.g., boron). The portion 125 of the fin structure may have a height $h_2$ of approximately 35 nm.

In one or more implementations, the portion 125 of the fin structure may be doped by forming an epitaxial material 130 on the fin structure. The epitaxial material 130 may be formed by performing lithography to open a region of the fin structure and growing the epitaxial material 130 in the opened region, with dopants incorporated in the epitaxial material 130 that is grown. The epitaxial material 130 may include silicon or silicon-germanium with dopants incorporated in the silicon or silicon-germanium. Ion implantation may be performed to increase the doping concentration of the epitaxial material 130 (e.g., p+ doping). In one or more implementations, the epitaxial material 130 may be formed by epitaxial growth, drive-in anneal, and ion implantation.

In one or more implementations, the substrate material 105 may be a p-type substrate, the well region 115 and the portion 120 of the fin structure may include n-type dopants, and/or the epitaxial material 130 may include p-type dopants. In such implementations, the finFET device 100 may form a super junction LDMOS structure where the portion 120 of the fin structure is depleted by the portion 125 of the fin structure. Epitaxy dopant diffusion may be blocked by the oxide material 110 such that a doping profile of the portion 120 of the fin structure is substantially unaffected by the epitaxial growth and/or ion implantation utilized for forming a doping profile of the portion 125 of the fin structure.

Figure 2:
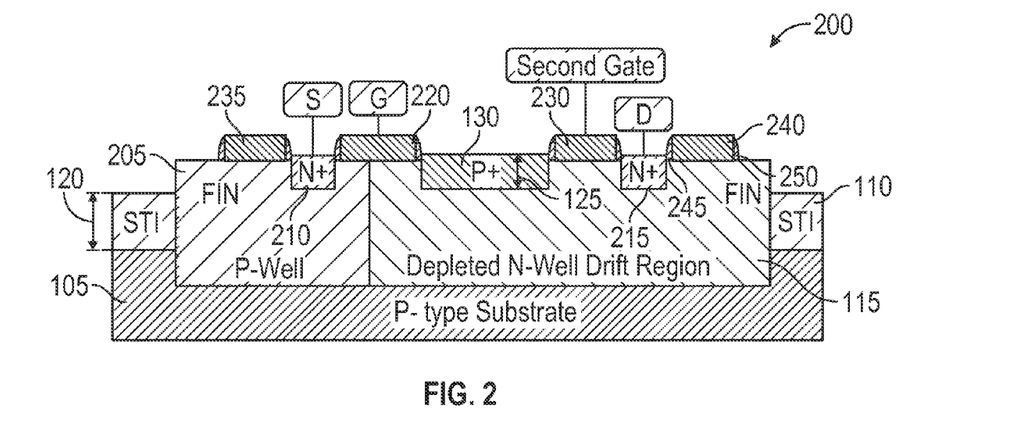
FIG. 2 illustrates a cross-sectional view of a finFET device along a direction parallel to a fin length, in accordance with one or more implementations.

FIG. 2 illustrates a cross-sectional view of a finFET device 200 along a direction parallel to a fin length, in accordance with one or more implementations. In one or more implementations, the cross-sectional view illustrated in FIG. 2 is another view of the finFET device 100 of FIG. 1. Not all of the depicted components may be used, however, and one or more implementations may include additional components not shown in the figure. Variations in the arrangement and types of the components may be made without departing from the spirit or scope of the claims as set forth herein. Additional, different, or fewer components may be provided The finFET device 200 includes the substrate material 105, the oxide material 110, the well region 115, the portion 120 and the portion 125 of the fin structure, and the epitaxial material 130. The finFET device 200 includes a well region 205 that may have different doping (e.g., different type of dopants) from the well region 115. The finFET device 200 includes an epitaxial material 210 formed on the well region 205 and an epitaxial material 215 formed on the well region 115. The epitaxial material 210 and the epitaxial material 215 may have different doping (e.g., different type of dopants) from the epitaxial material 130.

In one or more implementations, the substrate material 105 may be a p-type substrate; the well region 115, the epitaxial material 210, and the epitaxial material 215 may include n-type dopants; and the well region 205 and the epitaxial material 130 may include p-type dopants. The finFET device 200 formed from such an arrangement of the p-type and n-type regions may be referred to as a super junction n-type LDMOS (NLDMOS) device with an associated NLDMOS doping profile. The well region 115 (e.g., an n-well drift region) may be depleted by the adjacent p-regions (e.g., the well region 205 and the epitaxial material 130). For a PLDMOS device, the p-type and the n-type regions are reversed from that previously described (e.g., the well region 205 of the fin structure may be doped with n-type dopants, the epitaxial material 130 may include n-type dopants, and so forth). In one or more implementations, the well region 115 may have a doping concentration lower than a doping concentration of the epitaxial material 210 and/or the epitaxial material 215. The well region 205 may have a doping concentration lower than that of the epitaxial material 130. The substrate material 105 may have a doping concentration lower than that of the well region 205 and the epitaxial material 130.

In one or more implementations, for p-type doping, boron may be utilized as the dopant material. For n-type doping, phosphorus or arsenic may be utilized as the dopant material. Doping concentration for the well regions 115 and/or 205 may be between $10^{18}$ cm$^{-3}$ and $10^{19}$ cm$^{-3}$. Doping concentration for the epitaxial materials 130, 210, and/or 215 may be between $10^{20}$ cm$^{-3}$ and $10^{21}$ cm$^{-3}$. The dopant materials and doping concentrations are provided by way of non-limiting example, and other dopant materials and doping concentrations may be utilized. The type of dopant (e.g., p-type, n-type), dopant material, and doping concentration may be selected based on, for instance, device characteristics such as threshold voltage requirements.

In one or more implementations, a source contact and a drain contact may be coupled to the epitaxial material 210 and the epitaxial material 215, respectively. A gate structure 220 may be disposed between the epitaxial material 130 and the epitaxial material 210. A gate structure 230 may be disposed between the epitaxial material 130 and the epitaxial material 215. The gate structure 220 and the gate structure 230 may be utilized as a first gate and a second gate of the finFET device 200.

Example bias voltages applied to the source contact, the gate structure 220, the gate structure 230, and the drain contact may be 0 V, 1.8 V, 1.8 V, and 3.3 V, respectively. In one or more implementations, the gate structure 230 may be biased to deplete a channel below the gate structure 230. In one or more implementations, on the drain side, the epitaxial material 130 may allow for depletion of the portion 120 of the fin structure. On the source side, the well region 205 may be selected (e.g., dopant type, doping concentration) such that the epitaxial material 210 in a portion of the fin structure above the oxide material 110 does not fully deplete a portion of the fin structure in the oxide material 110.

A gate structure 235 and a gate structure 240 may be included to set a boundary for (e.g., terminate) the fin structure. Spacers (e.g., a spacer 245 and 250) may be formed adjacent to one or more of the gate structures 220, 230, 235, and/or 240. The spacers may be a dielectric material, such as silicon dioxide. The gate structures 220, 230, 235, and 240 may include an oxide material, a dielectric material, and a work function metal. For explanatory purposes, the oxide material, dielectric material, and work function metal are not shown in FIG. 2.

Although a single fin structure is shown in FIGS. 1 and 2, in one or more implementations, additional fin structures may be disposed on the substrate material 105. In one or more implementations, the gate structures 220, 230, 235, and/or 240 may straddle or surround multiple fin structures. In one or more implementations, more than one gate structure can straddle or surround one or more fin structures.

Figure 3:
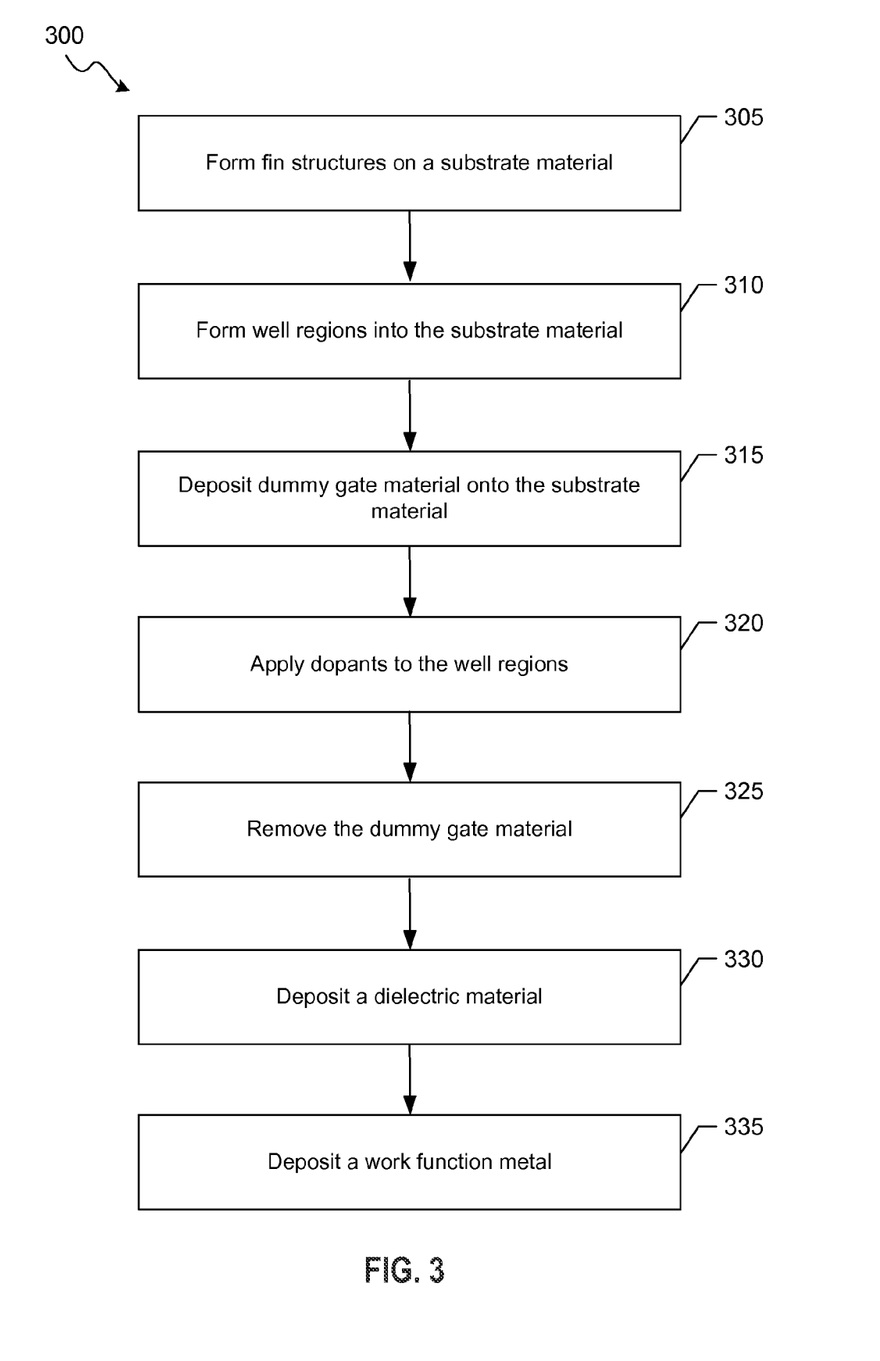
FIG. 3 illustrates a flow diagram of an example process for forming a finFET device in accordance with one or more implementations.

FIG. 3 illustrates a flow diagram of an example process 300 for forming a finFET device in accordance with one or more implementations. The blocks of the process 300 do not need to be performed in the order shown. It is understood that the depicted order is an illustration of one or more example approaches, and are not meant to be limited to the specific order or hierarchy presented. For example, based on preferences and/or specifications (e.g., cost, available materials, performance specifications), the specific order or hierarchy of the blocks may be rearranged or adjusted, and some blocks may be removed while others may be added. Two or more of the blocks can be performed simultaneously. In one or more implementations, the process 300 may be utilized to form the finFET devices 100 and/or 200 of FIGS. 1 and/or 2, respectively. Other finFET devices in accordance with one or more implementations may be formed by the process 300. Other processes in accordance with one or more implementations can be realized to form the finFET devices 100 and/or 200 of FIGS. 1 and/or 2.

For explanatory purposes, the example process 300 is primarily described herein with reference to FIGS. 4A through 4J. FIGS. 4A, 4C, 4E, 4G, and 4I illustrate top views of multiple finFET devices being formed on the substrate material 105, in accordance with one or more implementations. FIGS. 4B, 4D, 4F, 4H, and 4J illustrate cross-sectional views of a finFET device along a direction parallel to the fin length, in accordance with one or more implementations.

Figure 4A:
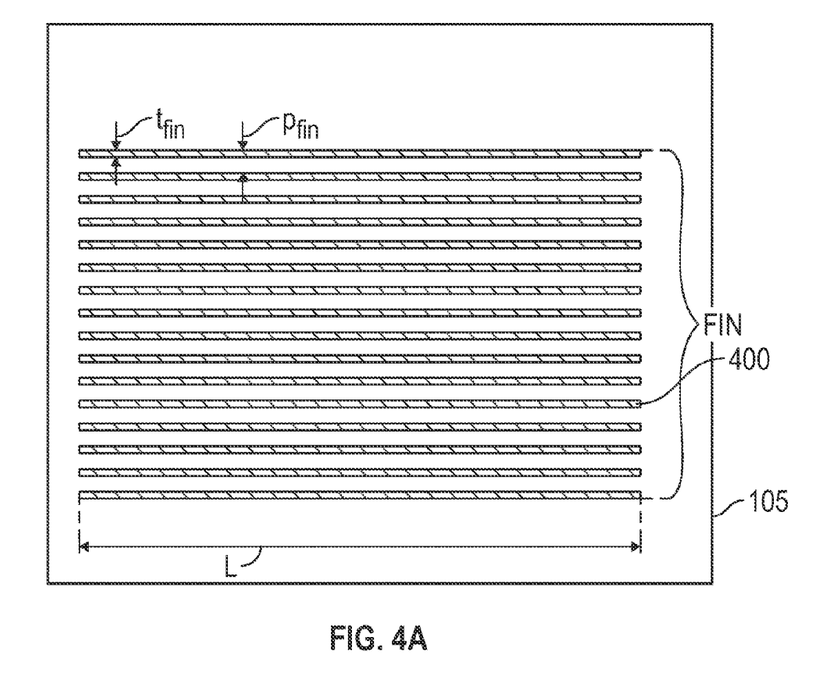
FIGS. 4A through 4J illustrate various top views and cross-sectional views associated with an example process for forming a finFET device in accordance with one or more implementations.
Figure 4B:
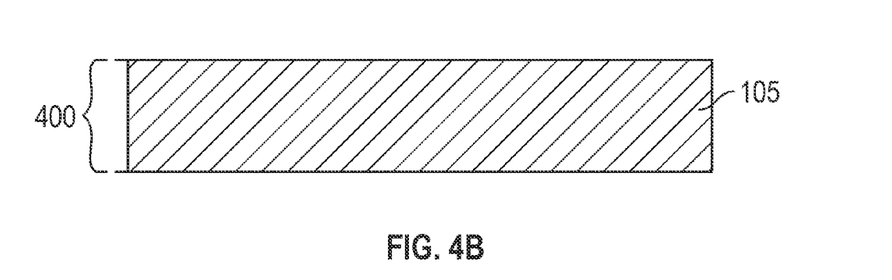

In FIGS. 4A and 4B, one or more fin structures are formed on the substrate material 105 (305). In one or more implementations, the fin structures may be formed using spacer lithography. A thickness $t_{fin}$ of a fin structure (e.g., a fin structure 400) may be 10 nm or lower. A fin pitch $p_{fin}$ may be 48 nm or lower. The fin pitch $p_{fin}$ may be measured from a point on one fin structure to the same point on another fin structure (e.g., an adjacent fin structure). A fin length L may be in the tens of microns. The substrate material 105 may extend beyond the box illustrated in FIG. 4A, such that FIG. 4A illustrates a portion of the substrate material 105. In one or more implementations, fin dimensions (e.g., fin width, fin length) and fin spacing between the fin structures need not be the same between any two adjacent or non-adjacent fin structures. The fin length employed may depend on a desired channel length and/or finger numbers. In one or more implementations, the fin structure may be cut to form shorter fin structures.

The substrate material 105 may be a p-type substrate. In one or more implementations, the substrate material 105 may be, or may include, semiconductor material such as silicon, silicon-germanium, and gallium-arsenide. In one or more implementations, the fin structures may be formed as part of an STI process. For example, the STI process may involve forming STI regions on the substrate material 105 and recessing the STI regions to form the fin structures. FIG. 4B illustrates the fin structure 400 along a direction parallel to the fin length. The fin structure 400 includes the substrate material 105.

Figure 4C:
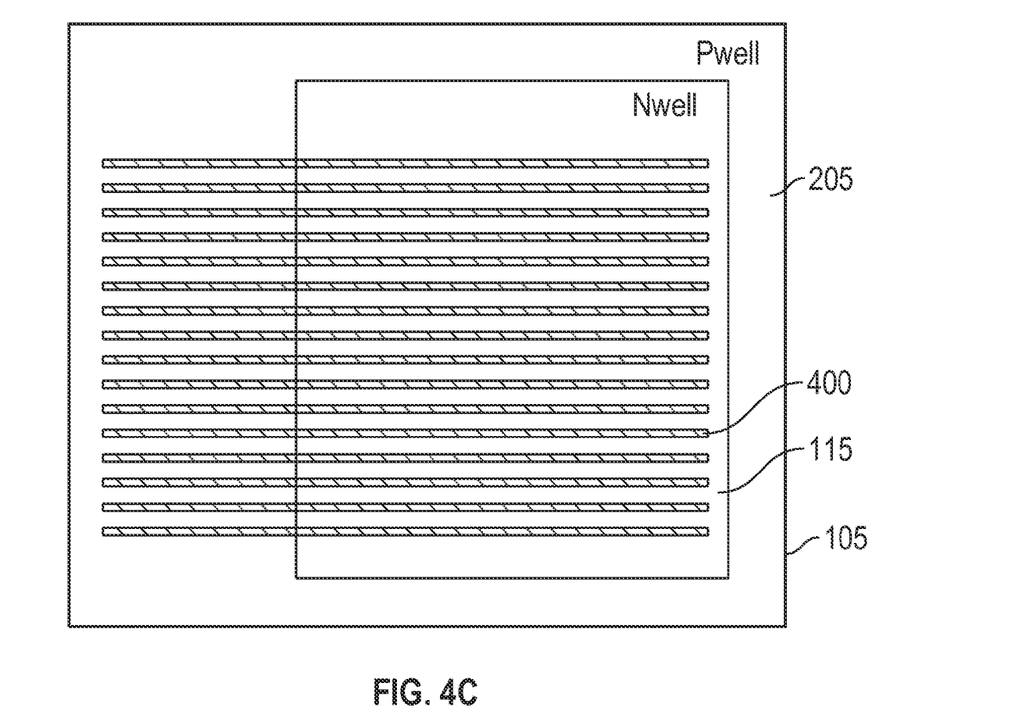
Figure 4D:
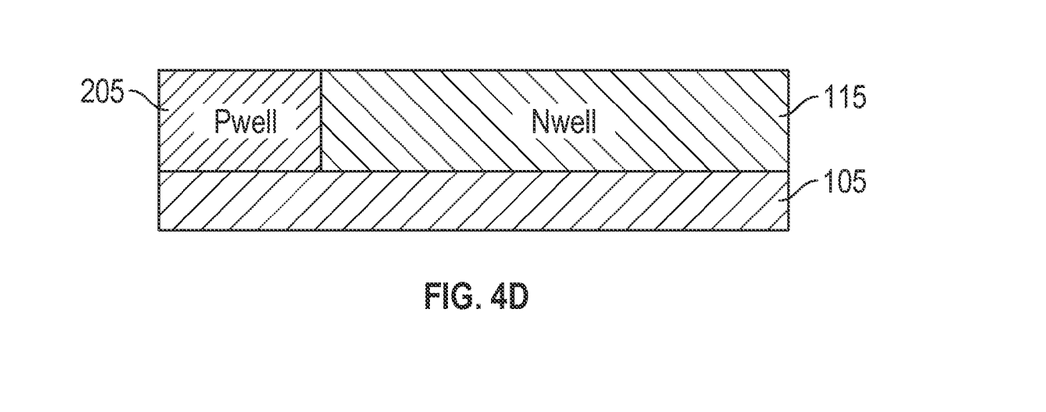

In FIGS. 4C and 4D, the well region 115 and the well region 205 are patterned and formed in the fin structures (e.g., the fin structure 400) (310). The well regions 115 and 205 may be formed by applying dopants (e.g., via ion implantation) throughout the substrate material 105. The dopant type and doping concentration of the well regions 115 and 205 may be tuned to meet specifications (e.g., cost, performance, etc.) for a resulting finFET device (e.g., the finFET device 100 and/or 200). In one or more implementations, the well regions 115 and 205 may be turned to fit a thermal voltage $V_t$ requirement. In one or more implementations, the well region 115 may be an n-type well region and the well region 205 may be a p-type well region. As shown in FIG. 4D, the fin structure 400 includes the substrate material 105 and the well regions 115 and 205 formed in the substrate material 105.

Figure 4E:
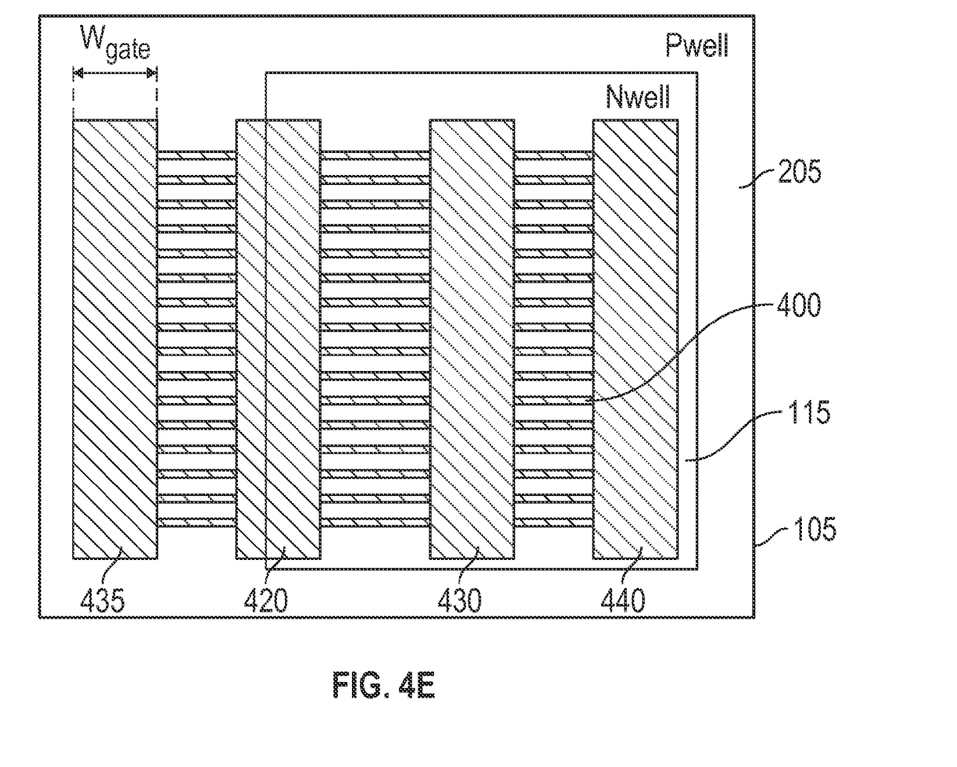
Figure 4F:
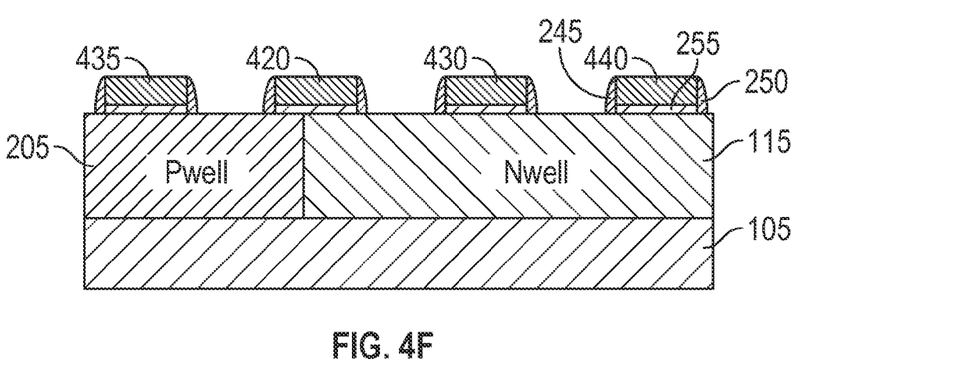

In FIGS. 4E and 4F, gate material is patterned and deposited onto the substrate material 105 (e.g., the top surface of the substrate material 105), including the fin structures, such as the fin structure 400 (315). The gate material may include polysilicon. The gate material may be utilized to form metal structures 420, 430, 435, and 440 for the respective gates. The metal structures 420, 430, 435, and/or 440 may straddle or surround multiple fin structures. In one or more implementations, the metal structures 420, 430, 435, and/or 440 are later removed and replaced, and therefore may be referred to as dummy gate materials or dummy structures. The width $w_{gate}$ of the metal structures 420, 430, 435, and/or 440 may be approximately 300 nm. As shown in FIG. 4F, the metal structures 420, 430, 435, and 440 are disposed on the fin structure 400. An oxide material 255, such as silicon dioxide, may exist under the metal structures 420, 430, 435, and/or 440 and form a part of the respective gates. In one or more implementations, the oxide material 255 is deposited prior to depositing the gate material. The oxide material 255 may be a thick oxide layer.

Figure 4G:
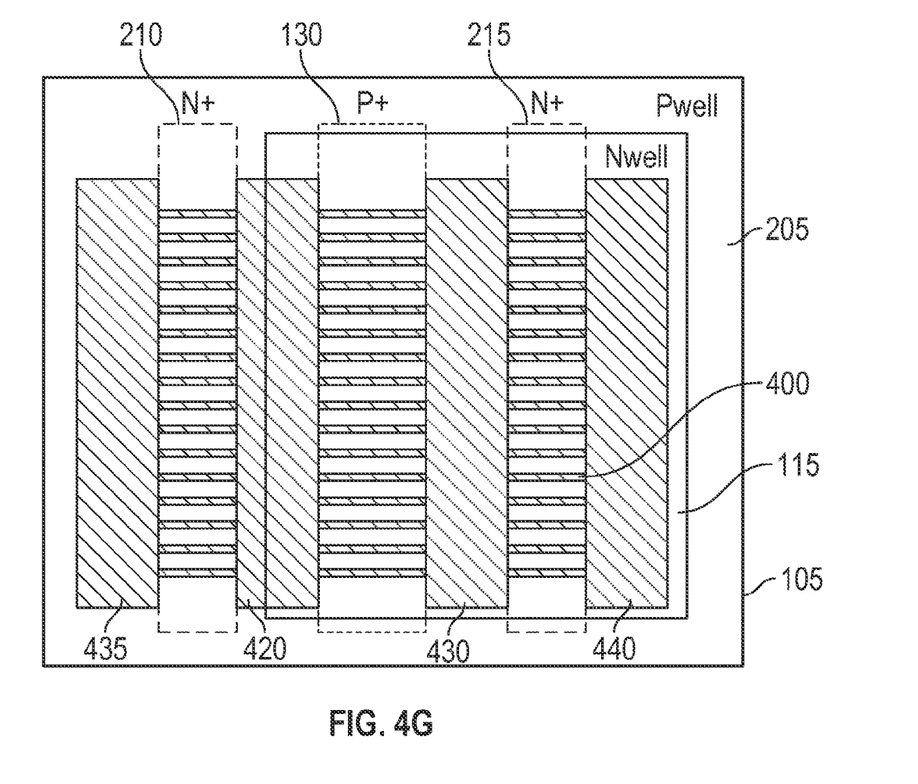
Figure 4H:
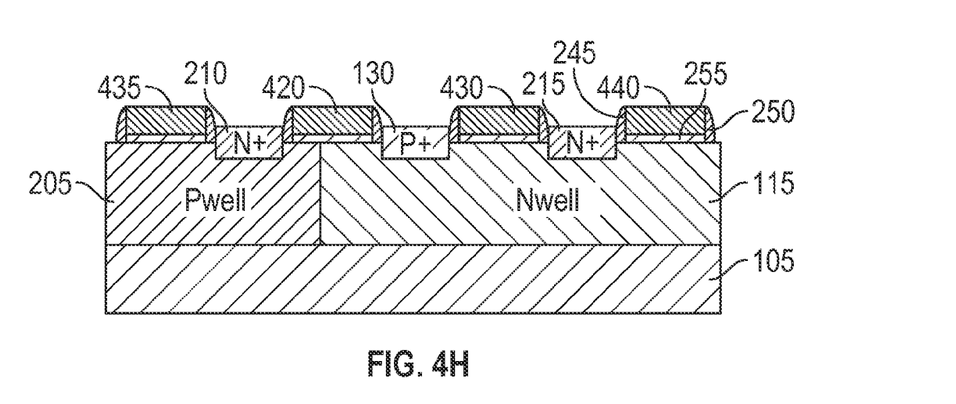

In FIGS. 4G and 4H, the well regions 115 and 205 are doped (320). In one or more implementations, the well regions 115 and 205 may be doped by performing lithography to open regions of the fin structures and growing the epitaxial materials 130, 210, and 215 in the opened regions, with dopants incorporated in the epitaxial materials 130, 210, and 215 that are grown. The epitaxial materials 130, 210, and/or 215 may be silicon or silicon-germanium with dopants incorporated in the silicon or silicon-germanium. The epitaxial material 130 may contain different doping (e.g., different type of dopants) from the epitaxial materials 210 and 215. The epitaxial material 130 is disposed between the metal structures 420 and 430, the epitaxial material 210 is disposed between the metal structures 420 and 435, and the epitaxial material 215 is disposed between the metal structures 430 and 440. As shown in FIG. 4H, a finFET device has been formed based on the fin structure 400. The epitaxial material 210 and the epitaxial material 215 may be coupled to a source contact and a drain contact, respectively. The metal structures 420 and 430 may be utilized as a respective contact for a first gate and a second gate of the finFET device (e.g., the finFET device 100 and/or 200).

In one or more implementations, ion implantation may be performed to increase the doping concentration of the epitaxial material 130 (e.g., p+ doping), the epitaxial material 210 (e.g., n+ doping), and/or the epitaxial material 215 (e.g., n+ doping). In one or more implementations, the epitaxial materials 130, 210, and/or 215 may be formed by epitaxial growth, drive-in anneal, and/or ion implantation. A depth (e.g., vertical direction in FIG. 4H) of the epitaxial materials 130, 210, and/or 215 may be tuned based on, for instance, doping concentration in the epitaxy and ion implantation. A length (e.g., horizontal direction in FIG. 4H) of the epitaxial materials 130, 210, and/or 215 may be tuned through lithography.

Figure 4I:
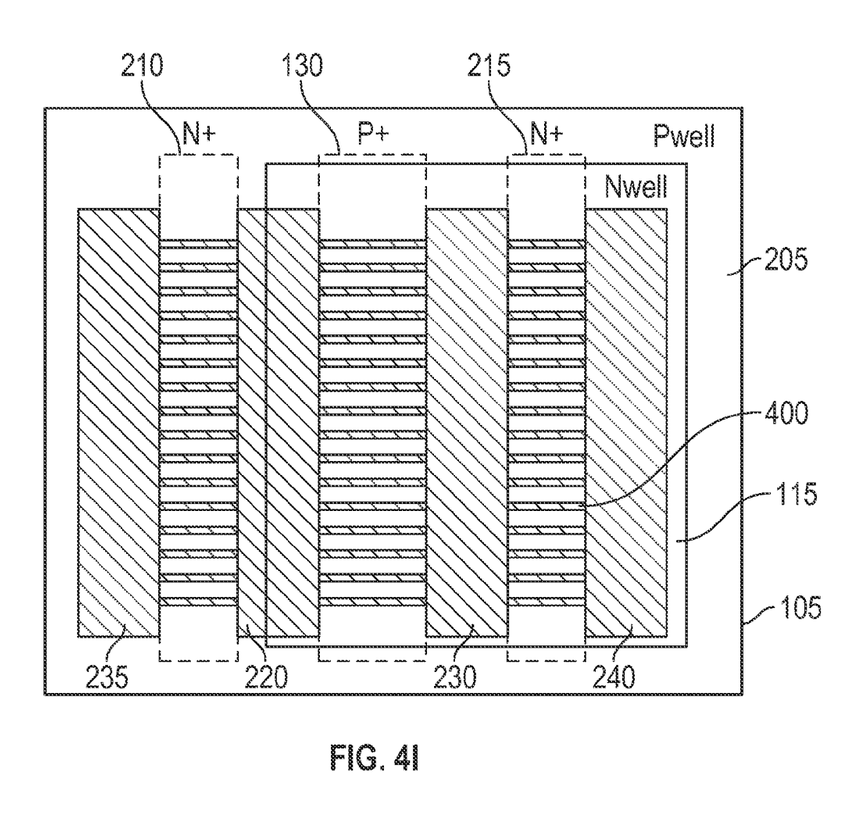
Figure 4J:
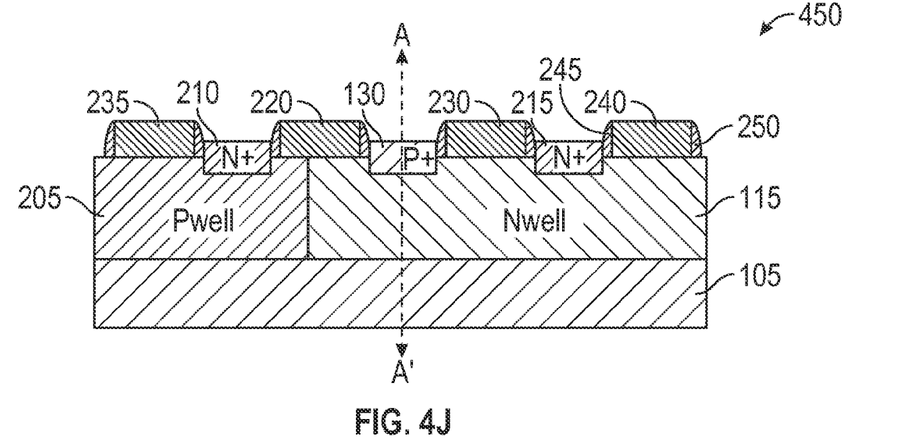

In one or more implementations, the metal structures 420, 430, 435, and 440 may be dummy structures that are removed. In FIGS. 4I and 4J, the metal structures 420, 430, 435, and 440 are removed and the gate structures 220, 230, 235, and 240 are formed. The gate structures 220, 230, 235, and 240 may straddle or surround multiple fin structures. In one or more implementations, the gate structures 220, 230, 235, and 240 may be formed by removing the metal structures 420, 430, 435, and 440 (325), depositing a dielectric material (not shown) (330), and depositing a work function metal (335).

The gate structures 220, 230, 235, and 240 may include the oxide material 255, dielectric material, and work function metal. For explanatory purposes, the oxide material 255, dielectric material, and work function metal are not shown in FIG. 4J. In one or more implementations, the work function metal may be utilized in forming the gate structures 220, 230, 235, and 240. Alternatively or in addition, a gate metal may be deposited on the work function metal and utilized in forming the gate structures 220, 230, 235, and 240. As shown in FIG. 4J, a finFET device 450 has been formed based on the fin structure 400. With reference to FIGS. 2, 4I, and 4J, the epitaxial material 210 and the epitaxial material 215 may be coupled to a source contact and a drain contact, respectively. The gate structures 220 and 230 may be utilized as a respective contact for a first gate and a second gate of the finFET device 450. In one or more implementations, the finFET device 450 illustrated in FIG. 4J may be the finFET device 100 and/or 200 of FIGS. 1 and/or 2, respectively.

Figure 5:
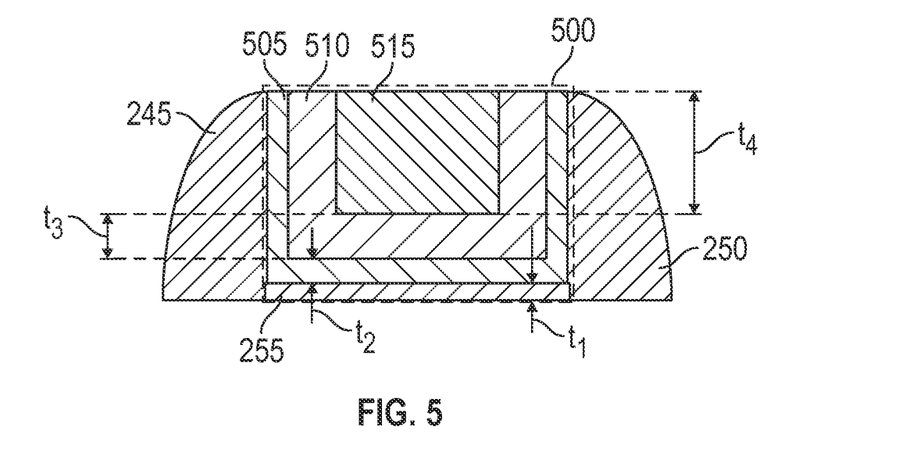
FIG. 5 illustrates a cross-sectional view of an example gate structure in accordance with one or more implementations.

FIG. 5 illustrates a cross-sectional view of an example gate structure 500 in accordance with one or more implementations. The gate structure 500 is surrounded by spacers 245 and 250. The gate structure 500 may be utilized as the gate structures 220, 230, 235, and/or 240 of FIGS. 2, 4I, and 4J. The gate structure 500 may include the oxide material 255, such as silicon dioxide. The gate structure 500 may include a dielectric material 505 disposed on the oxide material 255. The dielectric material 505 may include a high-k dielectric (e.g., hafnium-based or aluminum-based dielectric material). The gate structure 500 may include a work function metal 510 (e.g., titanium aluminide and/or titanium nitride) disposed on the dielectric material 505. The gate structure 500 may include a metal material 515. The metal material 515 may include, or may be, a low-resistance metal bulk material, such as tungsten. In one or more implementations, a thickness $t_1$ of the oxide material 255 may be approximately 10 Å, a thickness $t_2$ of the dielectric material 505 may be approximately 20 Å, a thickness $t_3$ of the work function metal 510 may be approximately 100 Å, and/or a thickness $t_4$ of the metal material 515 may be approximately 200 Å.

In one or more implementations, the dielectric material 505 may be silicon dioxide. In one or more implementations, the dielectric material 505 may be a high-k dielectric material. A higher dielectric constant k may allow for a thicker layer of dielectric material to be utilized (e.g., for tunneling considerations). The high-k dielectric material may include, by way of non-limiting example, hafnium oxide, hafnium silicon oxide, lanthanum oxide, lanthanum aluminum oxide, yttrium oxide, lead zinc niobate, among other high-k dielectric materials. In one or more implementations, the work function metal may include, by way of non-limiting example, titanium carbide, titanium aluminide, tantalum nitride, titanium nitride, tungsten, tungsten nitride, iridium dioxide, among other metals. The work function metal 510 can be doped. In one or more implementations, the work function metal 510 can be part of or utilized as the gate metal and not a separate layer of metal. In one or more implementations, the gate metal may include work function materials (e.g., titanium nitride, titanium aluminide, etc.) and a low resistance metal (e.g., tungsten) disposed on the work function materials.

In one or more implementations, more than one layer of dielectric material (e.g., dielectric material 505) may be disposed, with each dielectric layer being of a different dielectric from an adjacent dielectric layer. Any dielectric layer can be of a thickness equal to or different from an adjacent dielectric layer. In one or more implementations, more than one layer of work function metal (e.g., work function metal 510) may be disposed, with each metal layer being of a different metal from an adjacent metal layer. Any metal layer can be of a thickness equal to or different from an adjacent metal layer. The multiple layers of work function metal may be referred to as a work function metal stack. In one or more implementations, the work function metal stack may include, from bottom (silicon interface) to top, a block layer (e.g., titanium nitride, tantalum nitride), an adhesion layer (e.g., titanium), a work function layer (e.g., titanium nitride, tantalum nitride), and a block layer.

Figure 6:
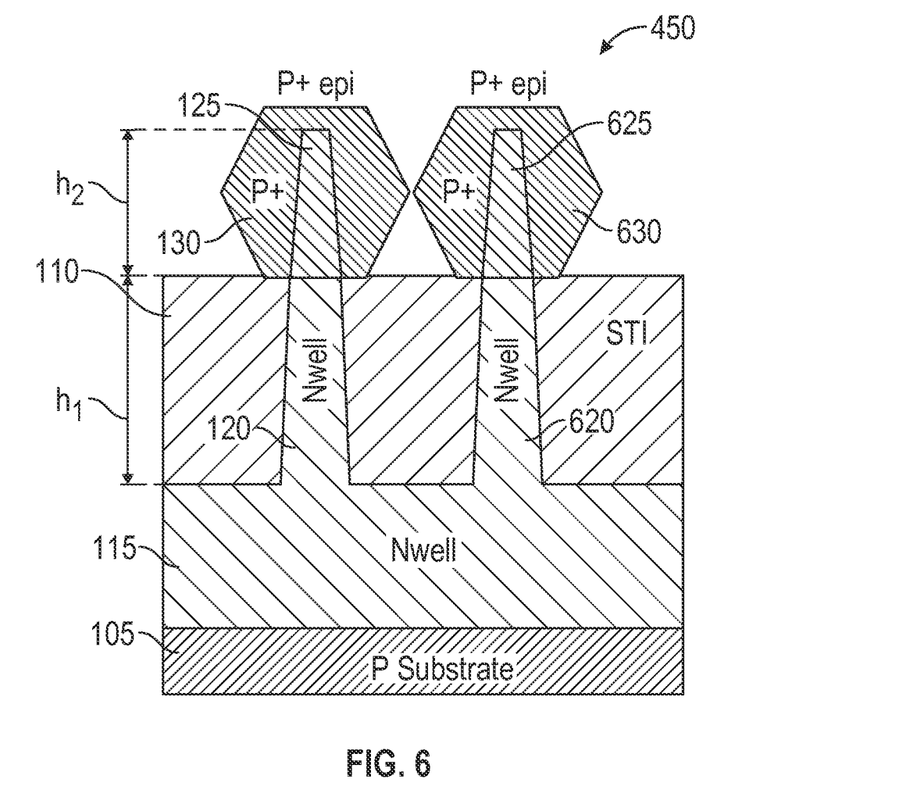
FIG. 6 illustrates a cross-sectional view of the finFET device along A-A' of FIG. 4J, which is a direction perpendicular to a fin length, in accordance with one or more implementations.

FIG. 6 illustrates a cross-sectional view of the finFET device 450 along A-A' of FIG. 4J, which is a direction perpendicular to a fin length, in accordance with one or more implementations. In one or more implementations, the finFET device 450 illustrated in FIG. 6 may be the finFET device 100 and/or 200 of FIGS. 1 and/or 2, respectively. The cross-sectional view illustrates two fin structures. The finFET device 450 may include the substrate material 105 with the top surface and the bottom surface, and the fin structures disposed on the top surface. The oxide material 110 may be disposed on the top surface and surround the fin structures. In one or more implementations, the oxide material 110 may be grown as part of an STI process. The oxide material 110 is adjacent to the portions 120 and 620 as well as between the portions 120 and 620. The fin structure on the left may be the fin structure 400 of FIG. 4A, whereas the fin structure on the right may be a fin structure adjacent to the fin structure 400. Although two fin structures are shown in FIG. 6, in one or more implementations, additional fin structures may be disposed on the substrate material 105. Adjacent fin structures may be separated from one another by the oxide material 110.

The well region 115 may be formed in the substrate material 105. The forming of the well region 115 may include applying dopants to at least a portion of the substrate material 105 and portions 120 and 620 of the fin structures. The portions 120 and 620 of the fin structures may have a height $h_1$ of approximately 60 nm. Portions 125 and 625 of the fin structures may be doped differently from the portions 120 and 620. The portions 125 and 625 of the fin structures may be doped by forming the epitaxial material 130 and an epitaxial material 630 on the fin structures. The portions 125 and 625 may have a height $h_2$ of approximately 35 nm. In one or more implementations, the substrate material 105 may be a p-type substrate, the well region 115 and the portions 120 and 620 of the fin structures may include n-type dopants, and the epitaxial materials 130 and 630 may include p-type dopants.

In one or more implementations, the finFET device 450 forms a super junction LDMOS structure where the portions 120 and 620 of the fin structures are depleted by the portions 125 and 625 of the fin structures. Epitaxy dopant diffusion may be blocked by the oxide material 110 such that a doping profile of the portions 120 and 620 of the fin structures is substantially unaffected by the epitaxial growth and/or ion implantation utilized for forming a doping profile of the portions 125 and 625 of the fin structures.

In one or more implementations, each of the fin structures may have a cross-sectional view along a direction parallel to the fin length that is the same as, or similar to, that illustrated in FIGS. 2, 4H, or 4J. The finFET device 450 formed from such an arrangement of the p-type and n-type regions may be a super junction NLDMOS device with an associated NLDMOS doping profile. The well region 115 (e.g., an n-well drift region) may be depleted by the adjacent p-regions (e.g., the well region 205, the epitaxial material 130, the epitaxial material 630). For a PLDMOS device, the p-type and the n-type regions are reversed from that previously described (e.g., the well region 205 of the fin structure may be doped with n-type dopants, the epitaxial material 130 may include n-type dopants, and so forth). In one or more implementations, the well region 115 may have a doping concentration lower than a doping concentration of the epitaxial material 210 and/or the epitaxial material 215. The well region 205 may have a doping concentration lower than that of the epitaxial material 130. The substrate material 105 may have a doping concentration lower than that of the well region 205 and the epitaxial material 130. The type of dopant, dopant material, and doping concentration may be selected based on, for instance, device characteristics such as threshold voltage requirements.

Figure 7:
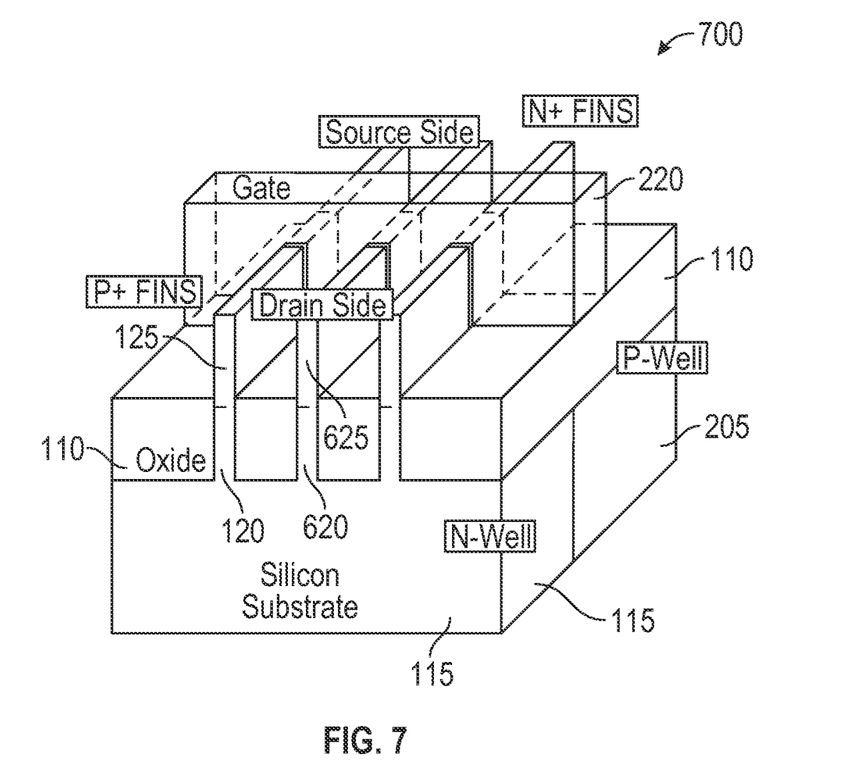
FIG. 7 illustrates a three-dimensional view of a finFET device in accordance with one or more implementations.

FIG. 7 illustrates a three-dimensional view of a finFET device 700 in accordance with one or more implementations. The three-dimensional view illustrates three fin structures. In one or more implementations, the three-dimensional view illustrated in FIG. 7 is another view of the finFET devices 100, 200, and/or 450 of FIGS. 1, 2, and/or 6, respectively. Not all of the depicted components may be used, however, and one or more implementations may include additional components not shown in the figure. Variations in the arrangement and types of the components may be made without departing from the spirit or scope of the claims as set forth herein. Additional, different, or fewer components may be provided.

The finFET device 700 may include a substrate material (e.g., the substrate material 105) with a top surface and a bottom surface, and the fin structures disposed on the top surface. The oxide material 110 may be disposed on the top surface and surround the fin structures. The oxide material 110 is adjacent to a portion of the fin structures (e.g., the portions 120 and 620) as well as between the fin structures. The left-most fin structure may be the fin structure 400 of FIG. 4A, whereas the two fin structures on the right may be fin structures adjacent to the fin structure 400. Although three fin structures are shown in FIG. 7, in one or more implementations, fewer or more fin structures may be disposed on the substrate material. Adjacent fin structures may be separated from one another by the oxide material 110.

The well region 115 may be formed in the substrate material. Portions (e.g., the portions 125 and 625) of the fin structures above the oxide material 110 may be doped differently from the portions (e.g., the portions 120 and 620) in the oxide material 110. The portions (e.g., the portions 125 and 625) of the fin structures may be doped by forming an epitaxial material (e.g., the epitaxial material 130 and 630) on the fin structures. The well region 205 may be formed in the substrate material and may have different doping (e.g., different type of dopants) from the well region 115. An epitaxial material (e.g., the epitaxial material 210) may be formed on the well region 205. The epitaxial material (e.g., the epitaxial material 130) on the well region 115 and the epitaxial material (e.g., the epitaxial material 210) on the well region 205 may have different doping (e.g., different type of dopants).

In one or more implementations, the finFET device 700 includes a drain side and a source side. The gate structure 220 is disposed between the drain side and the source side and straddles and surrounds the fin structures. The gate structure 220 may be utilized as one of multiple gates (not shown) of the finFET device 700. In one or more implementations, the gate structure 220 has been utilized to replace a dummy structure (e.g., metal structure 420 of FIG. 4F).

In one or more implementations, on the drain side, the substrate material may be a p-type substrate, the well region 115 and the portions (e.g., the portions 120 and 620) of the fin structures in the oxide material 110 may include n-type dopants, and the portions (e.g., the portions 125 and 625) of the fin structures above the oxide material 110 may include p-type dopants. On the source side, the well region 205 and portions of the fin structures in the oxide material 110 may include p-type dopants, and portions of the fin structures above the oxide material 110 may include n-type dopants. The portions of the fin structures above the oxide material 110 may be doped by forming the epitaxial material (e.g., the epitaxial material 210) on the well region 205.

In one or more implementations, on the drain side, the epitaxial material (e.g., the epitaxial material 130) on the portions (e.g., the portions 125 and 625) of the fin structures above the oxide material 110 may allow for depletion of the respective portions (e.g., the portions 120 and 620) of the fin structures in the oxide material 110. On the source side, the well region 205 may be selected (e.g., dopant type, doping concentration) such that the epitaxial material (e.g., the epitaxial material 210) in the portions of the fin structures above the oxide material 110 does not fully deplete the respective portions of the fin structures in the oxide material 110.

In one or more implementations, the subject technology allows for finFET devices that include a super junction LDMOS structure with multiple alternating regions of n- and p-type doped semiconductor. The alternating regions may facilitate depletion of a region at a relatively low voltage and may result in a high breakdown voltage. One or more drift regions (e.g., n-type channel, n-type portion of a fin structure) may be depleted by one or more adjacent p-type regions (e.g., a p-type well region, a p-type portion of a fin structure). Breakdown voltage may be increased through such depletion. In one or more implementations, the subject technology allows for smaller devices that may be operated at higher voltages and may have lower on-resistance. The finFET devices, such as the finFET devices 100, 200, 450, and/or 700 of FIGS. 1, 2, 6, and/or 7, respectively, may be utilized in power amplifiers, radio frequency (RF) circuits, among other devices. By way of non-limiting example, the breakdown voltage may be between 3 V and 6 V for the finFET devices, dependent on application within which the finFET devices are employed.

It is noted that dimensional aspects (e.g., gate width, oxide thickness, fin height, fin length) provided above are examples and that other values for the dimensions may be utilized in accordance with one or more implementations. Furthermore, the dimensional aspects provided above are generally nominal values. As would be appreciated by a person skilled in the art, each dimensional aspect, such as an oxide thickness, has a tolerance associated with the dimensional aspect. For example, in terms of an oxide thickness, the tolerance can be a function of the process utilized in depositing or growing the oxide.

As used herein, the "gate" refers to an insulated gate terminal of a FET. The physical structure of the gate terminal is referred to as a gate electrode. "Source/drain (S/D) terminals" refer to the terminals of a FET between which conduction occurs under the influence of an electric field subsequent to inversion of the semiconductor surface under the influence of an electric field resulting from a voltage applied to the gate terminal of the FET. Generally, the source and drain terminals of a FET are fabricated such that the source and drain terminals are geometrically symmetrical. With geometrically symmetrical source and drain terminals, these terminals can be simply referred to as source/drain terminals. Designers may designate a particular source/drain terminal to be a "source" or a "drain" on the basis of the voltage to be applied to that terminal when the FET is operated in a circuit.

As used herein, the terms "contact" and "via" both refer to structures in a chip used for electrical connection of conductors from different interconnect levels of the chip. These terms can describe both an opening in an insulator in which the structure will be completed as well as the completed structure itself. For purposes of this disclosure, both contact and via refer to the completed structure.

As used herein, the terms "substrate" and "substrate material" refer to the physical object that is the basic workpiece transformed by various process operations into the desired microelectronic configuration. A typical substrate used for the manufacture of integrated circuits is a wafer. Wafers may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is commonly used for the manufacture of integrated circuits.

In the semiconductor industry environment of foundries and fabless companies, the foundries develop, specify, and provide the physical structures that designers use to implement their designs. Foundries provide manufacturing services to many fabless semiconductor companies, but to operate profitably they optimize their manufacturing processes to achieve high yields. Such optimizations generally require that limitations be placed on the variety of structures that can be produced by a particular manufacturing process. Consistent with the foregoing, foundries typically provide a limited set of transistor structures that are intended to cover a broad range of circuit applications.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, by way of non-limiting example, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

The predicate words "configured to" and "operable to" do not imply any particular tangible or intangible modification of a subject, but, rather, are intended to be used interchangeably. Terms such as "top", "bottom", "front", "rear", "side", "horizontal", "vertical", and the like refer to an arbitrary frame of reference, rather than to the ordinary gravitational frame of reference. Thus, such a term may extend upwardly, downwardly, diagonally, or horizontally in a gravitational frame of reference.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

Any implementation described herein as an "example" is not necessarily to be construed as preferred or advantageous over other implementations. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A fin-based field effect transistor (finFET) device, comprising:
    a substrate material having a top surface and a bottom surface;
    a first well region formed in the substrate material and comprising a first type of dopant;
    a first fin structure disposed on the top surface of the substrate material, wherein the first fin structure comprises a first portion and a second portion, the first portion comprising the first type of dopant;
    an oxide material disposed on the top surface of the substrate material and adjacent to the first portion of the first fin structure;
    at least one gate structure; and
    a first epitaxial material disposed over the second portion of the first fin structure, wherein the first epitaxial material comprises a second type of dopant, and wherein the first epitaxial material is adjacent to the at least one gate structure.

2. The finFET device of claim 1:
    wherein the at least one gate structure comprises:
        a first gate structure disposed on the first fin structure; and
        a second gate structure disposed on the first fin structure, and
    wherein the first epitaxial material is disposed between the first gate structure and the second gate structure.

3. The finFET device of claim 1, wherein the at least one gate structure or the second gate structure comprises a work function material and a low resistance metal disposed on the work function material.

4. The finFET device of claim 1, wherein the first fin structure further comprises a third portion and a fourth portion adjacent to the third portion, the finFET device further comprising:
a second well region formed in the substrate material and doped with the second type of dopant; and
a second epitaxial material disposed over the fourth portion of the first fin structure and adjacent to the second well region, wherein the second epitaxial material comprises the first type of dopant and is configured to be coupled to a source contact,
wherein:
the oxide material is adjacent to the third portion of the first fin structure, and
the third portion of the first fin structure is doped with the second type of dopant.

5. The finFET device of claim 4, wherein the second well region is doped lighter than the first epitaxial material.

6. The finFET device of claim 4, wherein the at least one gate structure comprises a first gate structure disposed on the first fin structure, the finFET device further comprising:
a second gate structure disposed on the first fin structure; and
a third gate structure disposed on the first fin structure, wherein:
the first epitaxial material is disposed between the first gate structure and the second gate structure, and
the second epitaxial material is disposed between the first gate structure and the third gate structure.

7. The finFET device of claim 1, wherein the first fin structure further comprises a third portion and a fourth portion adjacent to the third portion, the finFET device further comprising:
a second epitaxial material disposed over the fourth portion of the first fin structure and adjacent to the first well region, wherein the second epitaxial material comprises the first type of dopant and is configured to be coupled to a drain contact,
wherein:
the oxide material is adjacent to the third portion of the first fin structure,
the third portion of the first fin structure is doped with the first type of dopant.

8. The finFET device of claim 1, further comprising a second fin structure disposed on the top surface of the substrate material, the second fin structure comprising a first portion doped with the first type of dopant and a second portion doped with the second type of dopant, wherein the oxide material is adjacent to the first portion of the second fin structure.

9. The finFET device of claim 8, wherein the at least one gate structure comprises a first gate structure disposed on the first fin structure and the second fin structure, the finFET device further comprising:
a second epitaxial material disposed over the second portion of the second fin structure, wherein the second epitaxial material comprises the second type of dopant; and
a second gate structure disposed on the first fin structure and the second fin structure,
wherein the first epitaxial material and the second epitaxial material are disposed between the first gate structure and the second gate structure.

10. The finFET device of claim 1, wherein:
the first type of dopant is an n-type dopant and the second type of dopant is a p-type dopant, and
the first portion is adjacent to the second portion.

11. A fin-based field effect transistor (finFET) device, comprising:
a semiconductor substrate material with a first type of dopant, wherein the semiconductor substrate material has a top surface and a bottom surface;
a first fin structure disposed on the top surface of the semiconductor substrate material;
a first well region formed in a portion of the first fin structure, wherein the first well region comprises a second type of dopant;
a second well region formed in a portion of the first fin structure, wherein the second well region comprises the first type of dopant;
a first epitaxial material disposed over the first well region, wherein the first epitaxial material comprises the first type of dopant; and
a second epitaxial material disposed over a portion of the second well region, wherein the second epitaxial material comprises the second type of dopant.

12. The finFET device of claim 11, further comprising:
a third epitaxial material disposed over a portion of the first well region,
wherein the third epitaxial material comprises the second type of dopant.

13. The finFET device of claim 12, wherein:
the second epitaxial material is configured to be coupled to a source contact,
the third epitaxial material is configured to be coupled to a drain contact,
the first well region is doped lighter than at least one of the second epitaxial material or the third epitaxial material, and
the second well region is doped lighter than the first epitaxial material.

14. The finFET device of claim 11, further comprising an oxide material disposed on the top surface of the semiconductor substrate material, wherein the oxide material is adjacent to at least one of the first well region or the second well region.

15. The finFET device of claim 11, further comprising:
a second fin structure disposed on the top surface of the semiconductor substrate material; and
an oxide material disposed on the top surface of the semiconductor substrate material, wherein the oxide material is in contact with the first fin structure and the second fin structure.

16. The finFET device of claim 11, further comprising a plurality of gate structures disposed on the first fin structure, wherein at least one of the plurality of gate structures is disposed on the first well region and at least one of the plurality of gate structures is disposed on the second well region.

17. The finFET device of claim 16, wherein at least one of the plurality of gate structures comprises a work function material and a low resistance metal disposed on the work function material.

18. A fin-based field effect transistor (finFET) device, comprising:
a substrate material having a top surface and a bottom surface;
a fin structure disposed on the top surface of the substrate material;
a first well region formed in the fin structure, wherein the first well region comprises a first type of dopant;
a first epitaxial material disposed over the first well region, wherein the first epitaxial material comprises a second type of dopant; and a second epitaxial material disposed over the first well region, wherein the second epitaxial material comprises the first type of dopant.

19. The finFET device of claim 18, further comprising:

a second well region formed in the fin structure, wherein the second well region comprises the second type of dopant;

a first gate structure disposed over at least a portion of the first well region and at least a portion of the second well region; and a second gate structure disposed over the first well region.

20. The finFET device of claim 19, further comprising:

a third epitaxial material disposed over the second well region, wherein the third epitaxial material comprises the first type of dopant.

* * * * *